United States Patent [19]

Mittel et al.

[11] Patent Number: 5,263,192
[45] Date of Patent: Nov. 16, 1993

[54] INTEGRATED RESONANT CIRCUIT WITH TEMPERATURE COMPENSATED QUALITY FACTOR

[75] Inventors: James G. Mittel; John J. Parkes, Jr., both of Boynton Beach, Fla.

[73] Assignee: Motorola, Inc., Schaumburg, Ill.

[21] Appl. No.: 863,892

[22] Filed: Apr. 6, 1992

[51] Int. Cl.$^5$ .................. H04B 1/26; H03H 11/08
[52] U.S. Cl. ............................ 455/313; 307/520; 333/215; 340/825.44; 455/339
[58] Field of Search ............. 333/213, 215; 307/520; 340/825.44; 455/313, 339

[56]   References Cited
   U.S. PATENT DOCUMENTS

| | | | |
|---|---|---|---|
| 4,051,385 | 9/1977 | Greenaway et al. | 333/215 X |
| 4,485,356 | 11/1984 | Fassino | 333/215 X |
| 4,947,141 | 8/1990 | Atkinson et al. | 333/215 X |

Primary Examiner—Paul Gensler
Attorney, Agent, or Firm—Kelly A. Gardner; Daniel R. Collopy; William E. Koch

[57]   ABSTRACT

A filter (13) for providing temperature compensation for the quality factor thereof comprises transconductance amplifiers (23 and 24) in a gyrator configuration coupled between an input node (21) and an output node (22). A parallel capacitor (25) is coupled between the input node (21) and a supply voltage, and a parallel resistor (26) is coupled between the input node (21) and the supply voltage. A series capacitor (27) is coupled to the output node (22), and a series resistor (28) is coupled between the second capacitor (27) and the supply voltage.

20 Claims, 1 Drawing Sheet

INTEGRATED RESONANT CIRCUIT WITH TEMPERATURE COMPENSATED QUALITY FACTOR

FIELD OF THE INVENTION

This invention relates in general to filters, and more specifically to filters having temperature compensation for the quality factor.

BACKGROUND OF THE INVENTION

Frequency selective devices, such as filters, pass signals of certain frequencies and attenuate signals of other frequencies. Many filter topologies require the use of resonant circuits comprising the parallel or series connection of transconductance amplifiers arranged in gyrator configurations, resistors, and capacitors on an integrated circuit. The resonant frequency $\omega_o$ is defined by the equation $\omega_o = g/C$, where g is the transconductance of the amplifiers and C is the capacitance of the circuit. The center frequency of these circuits can be held constant over temperature by controlling the ratio of the amplifier transconductance to the nodal capacitance. Most forms of integrated capacitors have a low temperature coefficient, thus the problem is reduced to maintaining constant transconductance. For a typical transconductance amplifier, this can be achieved by making the bias current of the amplifier linearly dependent on temperature.

The quality factor (Q) of the resonant circuit refers to the energy stored in the circuit vs. the energy dissipated in the circuit, and, if the resonant frequency is held constant, the Q determines the bandwidth of the filter. The Q is defined by the equation Q=gR in a parallel resonant circuit and by the equation Q=1/gR in a series resonant circuit, where R refers to the resistance of the circuit. If the transconductance of the amplifiers is held constant, the Q may be controlled by holding the resistance constant over temperature. However, typical integrated circuit resistors of reasonable size have relatively large temperature coefficients. In some known filters, the resistors are approximated by the use of transconductance amplifiers whose bias current is made linearly dependent on temperature. Although these filters hold the Q constant over temperature, they require more current drain and additional components. Use of this type of filter might create a problem, for example, if battery life is of concern or if the space is at a premium in the component area.

SUMMARY OF THE INVENTION

An electronic circuit having an input node and an output node comprises first and second transconductance amplifiers coupled between the input node and the output node. The first transconductance amplifier comprises a first positive input coupled to the input node, a first negative input coupled to a ground voltage, and a first output coupled to the output node. The second transconductance amplifier comprises a second positive input coupled to the ground voltage, a second negative input coupled to the output node, and a second output coupled to the input node. The electronic device further comprises a parallel capacitor coupled between the input node and the ground voltage and a parallel resistor coupled between the input node and the ground voltage for providing resistance. A series capacitor is coupled to the output node, and a series resistor is coupled between a second terminal of the series capacitor and the ground voltage for providing resistance.

DESCRIPTION OF A PREFERRED EMBODIMENT

Figure 1:
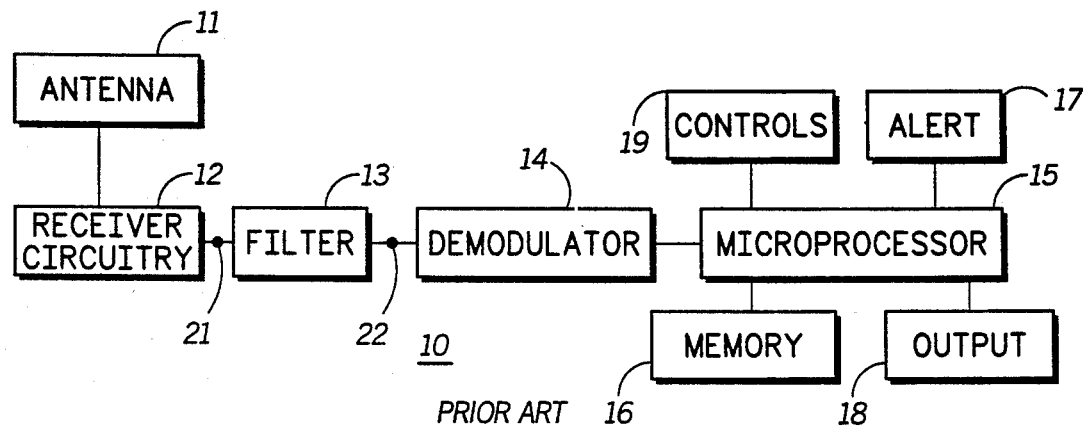
FIG. 1 is a block diagram of a typical selective call receiver.

Referring to FIG. 1, an electronic device for receiving signals, such as a selective call receiver 10, comprises an antenna 11 for receiving a modulated radio frequency (RF) signal that is shifted to an intermediate frequency (IF) by receiver circuitry 12. The modulated IF signal is filtered by a filter 13 to eliminate undesired frequencies, then is demodulated by a demodulator 14. Subsequent to demodulation, a microprocessor 15 coupled to the demodulator 14 processes the data in a manner well known to one skilled in the art. The microprocessor 15 compares an address contained in the demodulated signal with predetermined addresses contained in the memory 16 and, when substantially similar, alerts the user with an alert mechanism 17 that a signal has been received. If the demodulated signal contains optional message data, the optional output device 18 will present the message automatically or when manually selected by controls 19.

Figure 2:
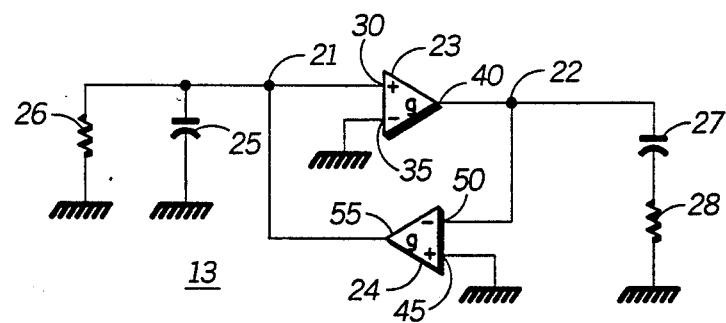
FIG. 2 is a schematic of the filter of FIG. 1 in accordance with an embodiment of the present invention.

Referring to FIG. 2, a filter 13 comprises transconductance amplifiers 23 and 24 in a gyrator configuration that are coupled between an input node 21 and an output node 22. A first of the transconductance amplifiers 23, 24 has a positive input 30 coupled to the input node 21 and a negative input 35 coupled to a ground voltage. An output 40 of the first transconductance amplifier 23 is coupled to the output node 22. A second of the transconductance amplifiers 23, 24 also has a positive input 45, which is coupled to the ground voltage, and a negative input 50, which is coupled to the output node 22. Additionally, an output 55 of the second transconductance amplifier 24 is coupled to the input node 21. A parallel capacitor 25 is coupled between the input node 21 and the ground voltage, and a parallel resistor 26 is coupled between the input node 21 and the ground voltage. A series capacitor 27 is coupled to the output node 22, and a series resistor 28 is coupled between the series capacitor 27 and the ground voltage. The filter 13 is a combination of a parallel resonant circuit and a series resonant circuit and resonates at a specific frequency $\omega_o$.

In one embodiment of the present invention, the parallel capacitor 25 has substantially the same capacitance as that of the series capacitor 27, and the transconductance amplifiers 23 and 24 have substantially the same transconductance. The resonant frequency $\omega_o$ of the circuit described in this embodiment is determined by the equation $\omega_o = g/C$, where g refers to the transconductance of the amplifiers 23 and 24 and C refers to the value of the capacitance of the capacitors 25 and 27. The quality factor (Q) of the filter 13 is given by the equation $$Q = \frac{gR_1}{1 + g^2 R_1 R_2},$$

where $R_1$ refers to the resistance of the parallel resistor 26 and $R_2$ refers to the resistance of the series resistor 28. As illustrated by this equation, the Q is proportional to the parallel resistor 26 and is inversely proportional to the series resistor 28. If the resistors 26 and 28 are typical integrated circuit resistors, i.e., the resistors 26 and 28 have large temperature coefficients, this corresponds to a large positive temperature coefficient for the Q of the parallel resonant circuit and a large negative temperature coefficient for the Q of the series resonant circuit. If the resistors 26 and 28 have substantially the same temperature coefficients, e.g., they are fabricated from the same material, the Q will remain constant over temperature if the circuit components are selected so that the equation $g^2 R_1 R_2 = 1$ is satisfied. In this case, the positive changes in the Q due to the parallel resistor 26 will essentially be cancelled by the negative changes in the Q due to the series resistor 28, and the bandwidth of the filter will remain constant as the temperature varies. Because the filter in accordance with the present invention uses only one extra resistor, space and cost considerations are minimized.

We claim:

1. An electronic circuit having an input node and an output node, comprising:
    first and second transconductance amplifiers coupled between the input node and the output node, wherein the first transconductance amplifier comprises a first positive input coupled to the input node, a first negative input coupled to a ground voltage, and a first output coupled to the output node, and wherein the second transconductance amplifier comprises a second positive input coupled to the ground voltage, a second negative input coupled to the output node, and a second output coupled to the input node;
    a parallel capacitor coupled between the input node and the ground voltage;
    a parallel resistive means coupled between the input node and the ground voltage for providing resistance;
    a series capacitor having a first terminal coupled to the output node; and
    a series resistive means coupled between a second terminal of the series capacitor and the ground voltage for providing resistance.

2. The electronic circuit in accordance with claim 1, wherein the parallel capacitor and the series capacitor have substantially the same capacitance.

3. The electronic circuit in accordance with claim 1, wherein the first and second transconductance amplifiers have substantially the same transconductance.

4. The electronic circuit in accordance with claim 1, wherein the parallel resistive means and the series resistive means have substantially the same temperature coefficient.

5. The electronic circuit in accordance with claim 1, wherein:
    the parallel capacitor and the series capacitor have substantially the same capacitance;
    the first and second transconductance amplifiers have substantially the same transconductance; and
    the parallel resistive means and the series resistive means have substantially the same temperature coefficient.

6. The electronic circuit in accordance with claim 1, wherein the parallel and series resistive means each comprise a resistor.

7. The electronic circuit in accordance with claim 6, wherein the parallel capacitor and the series capacitor have substantially the same capacitance.

8. The electronic circuit in accordance with claim 6, wherein the first and second transconductance amplifiers have substantially the same transconductance.

9. The electronic circuit in accordance with claim 6, wherein the parallel resistor and the series resistor have substantially the same temperature coefficient.

10. The electronic circuit in accordance with claim 6, wherein:
    the parallel capacitor and the series capacitor have substantially the same capacitance;
    the first and second transconductor amplifiers have substantially the same transconductance; and
    the parallel resistor and the series resistor have substantially the same temperature coefficient.

11. A selective call receiver, comprising:
    an antenna for receiving modulated radio frequency signals;
    receiver circuitry coupled to the antenna for shifting the frequency of the modulated radio frequency signal to an intermediate frequency;
    a filter coupled to the receiver circuitry for filtering the modulated intermediate frequency signal, the filter having an input node coupled to the receiver circuitry and an output node, comprising:
        first and second transconductance amplifiers coupled between the input node and the output node, wherein the first transconductance amplifier comprises a first positive input coupled to the input node, a first negative input coupled to a ground voltage, and a first output coupled to the output node, and wherein the second transconductance amplifier comprises a second positive input coupled to the ground voltage, a second negative input coupled to the output node, and a second output coupled to the input node;
        a parallel capacitor coupled between the input node and the ground voltage;
        a parallel resistive means coupled between the input node and the ground voltage for providing resistance;
        a series capacitor having a first terminal coupled to the output node; and
        a series resistive means coupled between a second terminal of the series capacitor and the ground voltage for providing a resistance;
    a demodulator coupled to the output node for demodulating the filtered signal; and
    a microprocessor coupled to the demodulator for processing the demodulated signal.

12. The selective cell receiver in accordance with claim 11, wherein the parallel capacitor and the series capacitor have substantially the same capacitance.

13. The selective call receiver in accordance with claim 11, wherein the first and second transconductance amplifiers have substantially the same transconductance.

14. The selective call receiver in accordance with claim 11, wherein the parallel resistive means and the series resistive means have substantially the same temperature coefficient.

15. The selective call receiver in accordance with claim 11, wherein:
    the parallel capacitor and the series capacitor have substantially the same capacitance;

the first and second transconductance amplifiers have substantially the same transconductance; and the parallel resistive means and the series resistive means have substantially the same temperature coefficient.

16. The selective call receiver in accordance with claim 11, wherein the parallel and series resistive means each comprise a resistor.

17. The selective call receiver in accordance with claim 16, wherein the parallel capacitor and the series capacitor have substantially the same capacitance.

18. The selective call receiver in accordance with claim 16, wherein the first and second transconductance amplifiers have substantially the same transconductance.

19. The selective call receiver in accordance with claim 16, wherein the parallel resistor and the series resistor have substantially the same temperature coefficient.

20. The selective call receiver in accordance with claim 16, wherein:

the parallel capacitor and the series capacitor have substantially the same capacitance;

the first and second transconductance amplifiers have substantially the same transconductance; and the parallel resistor and the series resistor have substantially the same temperature coefficient.

* * * * *